US012772759B2

(12) United States Patent
Kim et al.

(10) Patent No.: US 12,772,759 B2
(45) Date of Patent: Oct. 20, 2026

(54) THIN FILM DEPOSITION METHOD

(71) Applicant: JUSUNG ENGINEERING CO., LTD., Gwangju-Si (KR)

(72) Inventors: Yoon Jeong Kim, Gwangju-Si (KR); Jung Kyun Lee, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 406 days.

(21) Appl. No.: 18/560,924

(22) PCT Filed: May 4, 2022

(86) PCT No.: PCT/KR2022/006409
§ 371 (c)(1),
(2) Date: Nov. 14, 2023

(87) PCT Pub. No.: WO2022/245021
PCT Pub. Date: Nov. 24, 2022

(65) Prior Publication Data

US 2024/0258104 A1 Aug. 1, 2024

(30) Foreign Application Priority Data

May 17, 2021 (KR) ........................ 10-2021-0063491

(51) Int. Cl.
*H01L 21/02* (2006.01)
*H10D 30/67* (2025.01)
(Continued)

(52) U.S. Cl.
CPC ....... *H10P 14/6339* (2026.01); *H10D 30/673* (2025.01); *H10D 30/6739* (2025.01);
(Continued)

(58) Field of Classification Search
CPC ............. H10P 14/6339; H10P 14/6514; H10P 14/6532; H10P 14/662; H10P 14/69215;
(Continued)

(56) References Cited

U.S. PATENT DOCUMENTS

2015/0041875 A1* 2/2015 Perera .................. H10D 64/017 438/257
2015/0179438 A1* 6/2015 Ahmed ............... H10P 14/6504 438/590

FOREIGN PATENT DOCUMENTS

JP 2005159182 A 6/2005
JP 2009152640 A 7/2009
(Continued)

OTHER PUBLICATIONS

Written Opinion for PCT/KR2022/006409, mailed Aug. 12, 2022.
(Continued)

*Primary Examiner* — Cuong B Nguyen
(74) *Attorney, Agent, or Firm* — Renaissance IP Law Group LLP

(57) ABSTRACT

The present disclosure relates to a method for depositing a thin film, and more particularly, to a method for depositing a thin film, which forms a gate insulation film on a silicon carbide substrate.

In accordance with an exemplary embodiment, a method for depositing a thin film includes: preparing a silicon carbide substrate having a plurality of semiconductor regions; and
(Continued)

forming a gate insulation film on the silicon carbide substrate at a temperature of 100° C. to 400° C. through an atomic layer deposition process.

8 Claims, 3 Drawing Sheets

(51) Int. Cl.
*H10D 62/832* (2025.01)
*H10P 14/60* (2026.01)
*H10P 14/692* (2026.01)
*H10P 14/694* (2026.01)

(52) U.S. Cl.
CPC ..... *H10D 62/8325* (2025.01); *H10P 14/6514* (2026.01); *H10P 14/6532* (2026.01); *H10P 14/662* (2026.01); *H10P 14/69215* (2026.01); *H10P 14/69433* (2026.01); *H10D 30/6736* (2025.01)

(58) Field of Classification Search
CPC ........... H10P 14/69433; H10P 14/6336; H10P 95/00; H10D 30/673; H10D 30/6739; H10D 62/8325; H10D 30/6736; H10D 12/031; H10D 64/011; H10D 64/68; H10D 64/691; H10D 64/693; H10D 62/83; H10D 64/00; H10D 64/685; H10D 64/01; H10D 64/01332; C23C 16/02; C23C 16/455; C23C 16/45527; C23C 16/45525–45555
See application file for complete search history.

(56) References Cited

FOREIGN PATENT DOCUMENTS

| | | | |
|---|---|---|---|
| JP | 2010056567 | A | 3/2010 |
| JP | 2018517274 | A | 6/2018 |
| KR | 20010033812 | A | 4/2001 |
| KR | 20010073055 | A | 7/2001 |
| KR | 100469132 | B1 | 1/2005 |
| KR | 20050064570 | A | 6/2005 |
| KR | 20090055368 | A | 6/2009 |
| KR | 20180000722 | A | 1/2018 |
| KR | 20180123740 | A | 11/2018 |
| KR | 20190052001 | A | 5/2019 |
| TW | 201705427 | A | 2/2017 |
| WO | 2011152018 | A1 | 12/2011 |

OTHER PUBLICATIONS

Heo, Seung Chan et al., "Remote plasma atomic layer deposited Al2O3 4H SiC MOS capacitor with remote H2 plasma passivation and post metallization annealing", Microelectronic Engineering, vol. 147, pp. 239-243, 2015.

International Search Report for PCT/KR2022/006409, mailed Aug. 12, 2022.

Schiliro, E. et al., "Effect of SiO2 interlayer on the properties of Al2O3 thin films grown by plasma enhanced atomic layer deposition on 4H—SiC substrates", Physica Status Solidi A, vol. 214, No. 4, pp. 1-6, 2017.

* cited by examiner

THIN FILM DEPOSITION METHOD

TECHNICAL FIELD

The present disclosure relates to a method for depositing a thin film, and more particularly, to a method for depositing a thin film, which forms a gate insulation film on a silicon carbide substrate.

BACKGROUND ART

Silicon carbide (SiC) is a semiconductor having a band gap higher than that of general silicon. The silicon carbide has a breakdown voltage greater than that of silicon and exhibits low loss and excellent heat dissipation. Particularly, the silicon carbide may reduce a voltage drop to about 1/200 in comparison with a semiconductor device using silicon because the silicon carbide has an insulation breakdown field that is about 10 times greater than that of silicon. Thus, silicon carbide is recognized as an excellent semiconductor material that is not replaceable in the field of a display device or a power semiconductor device.

A transistor is used as a switching circuit in the display device or the power semiconductor device. The transistor includes a gate insulation film for blocking a current flowing between a source and a drain.

Typically, the gate insulation film is deposited at a high temperature of about 1200° C. when the thin film transistor is manufactured.

However, when the gate insulation film is formed in a state in which a silicon carbide substrate is heated at the high temperature, the substrate or the thin film formed on the substrate is damaged. This may cause a defect or degradation in function of the transistor of the display device or the power semiconductor device. Particularly, quality and reliability of the display device or the power semiconductor device using the transistor as the switching circuit are remarkably degraded.

RELATED ART DOCUMENT

Patent Document (Patent document 1) KR10-2009-0055368 A.

DISCLOSURE OF THE INVENTIVE CONCEPT

Technical Problem

The present disclosure provides a method for depositing a thin film, which form a gate insulation film on a silicon carbide substrate.

Technical Solution

In accordance with an exemplary embodiment, a method for depositing a thin film includes: preparing a silicon carbide substrate having a plurality of semiconductor regions; and forming a gate insulation film on the silicon carbide substrate at a temperature of 100° C. to 400° C. through an atomic layer deposition process.

The method may further include performing plasma surface treatment on the silicon carbide substrate before the forming of the gate insulation film.

The forming of the gate insulation film may include: supplying a source gas onto the silicon carbide substrate; performing plasma pre-treatment on the silicon carbide substrate; supplying a reactant gas onto the silicon carbide substrate; and performing plasma post-treatment on the silicon carbide substrate, and a process cycle including the supplying of the source gas, the performing of the pre-treatment, the supplying of the reactant gas, and the performing of the post-treatment may be performed a plurality of times.

The performing of the plasma pre-treatment and the performing of the plasma post-treatment may include: injecting a hydrogen gas onto the silicon carbide substrate; and discharging the hydrogen gas and generating plasma on the silicon carbide substrate.

The gate insulation film may include a high-K dielectric layer.

The gate insulation film may further include a silicon oxide layer or a silicon nitride layer disposed on at least one of upper and lower portions of the high-K dielectric layer.

The preparing of the silicon carbide substrate may prepare the silicon carbide substrate having a source region, a well region, and a drain region, and the forming of the gate insulation film may form the gate insulation film on the well region.

Advantageous Effects

According to the exemplary embodiment, the gate insulation film may be formed on the silicon carbide substrate through the low temperature process. Also, the time for increasing the temperature of the substrate to form the gate insulation film may be saved, and thus the time for manufacturing the display device or the power semiconductor device may be reduced.

Also, according to the exemplary embodiment, the display device or the power semiconductor device having the high breakdown voltage and the excellent heat dissipation property may be manufactured.

MODE FOR CARRYING OUT THE INVENTIVE CONCEPT

Figure 1:
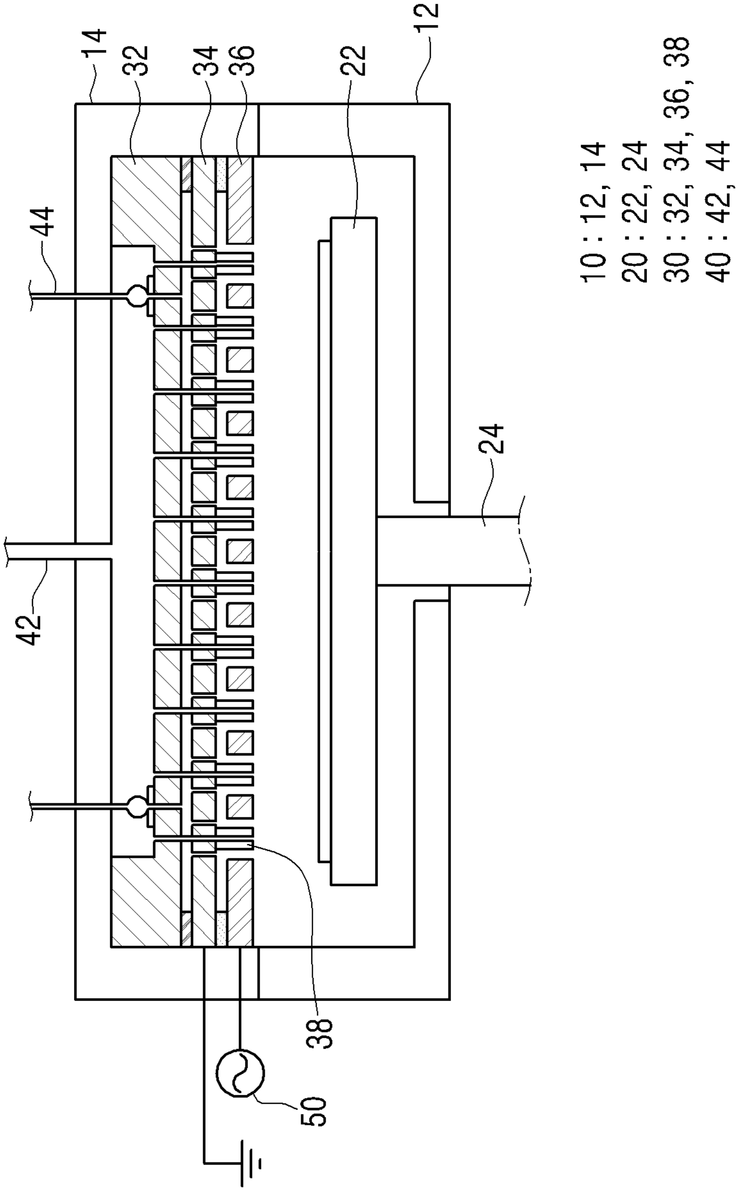
FIG. 1 is a schematic view illustrating a deposition apparatus in accordance with an exemplary embodiment.

Hereinafter, exemplary embodiments of the present inventive concept will be described in detail with reference to the accompanying drawings. The present inventive concept may, however, be embodied in different forms and should not be construed as limited to the embodiments set forth herein. Rather, these embodiments are provided so that the present inventive concept will be thorough and complete, and will fully convey the scope of the present inventive concept to those skilled in the art.

It will also be understood that when a layer, a film, a region or a plate is referred to as being 'on' another one, it can be directly on the other one, or one or more intervening layers, films, regions or plates may also be present.

Also, spatially relative terms, such as "above" or "upper" and "below" or "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In the drawings, the thicknesses of layers and regions are exaggerated for clarity. In the figures, like reference numerals refer to like elements throughout.

FIG. 1 is a schematic view illustrating a deposition apparatus in accordance with an exemplary embodiment.

Referring to FIG. 1, a deposition apparatus in accordance with an exemplary embodiment, which is for depositing a thin film, i.e., a gate insulation film, on a substrate, includes: a chamber 10; a substrate support unit 20 disposed in the chamber 10 and supporting a substrate provided in the chamber 10; a gas injection unit 30 disposed in the chamber 10 to face the substrate support unit 20 and injecting a process gas toward the substrate support unit 20; and a RF power supply 50 applying a power to generate plasma in the chamber 10. Also, the deposition apparatus may further include a gas supply unit 40 for supplying a gas to the gas injection unit 30 and a control unit (not shown) for controlling the RF power supply 50. Here, the gas injection unit 30 includes a first gas supply path for supplying a first gas, e.g., a source gas, and a second gas supply path for supplying a second gas, e.g., a reactant gas, and the first gas supply path and the second gas supply path are separated.

The chamber 10 has a predetermined processing space and maintains sealing thereof. The chamber 10 may include: a body 12 including an approximately circular or square flat portion and a sidewall portion extending upward from the flat portion and having a predetermined process space; and a cover 14 disposed on the approximately circular or square body 12 and to maintain the sealing of the chamber 10. However, the exemplary embodiment is not limited to the shape of the chamber 10. For example, the chamber 10 may be manufactured into various shapes in correspondence to a shape of a substrate.

An exhaust hole (not shown) may be formed in a predetermined area of a bottom surface of the chamber 10, and an exhaust pipe (not shown) connected to the exhaust hole may be disposed outside the chamber 10. Also, the exhaust pipe may be connected with an exhaust device (not shown). A vacuum pump such as a turbo-molecular pump may be used as the exhaust device. Thus, the inside of the chamber 10 may be vacuum-suctioned by the exhaust device to a predetermined reduced-pressure atmosphere, e.g., a predetermined pressure of 0.1 mTorr or less. The exhaust pipe may be installed on a side surface of the chamber 10 below the substrate support unit 20 that will be described later in addition to the bottom surface of the chamber 10. Also, a plurality of exhaust pipes and exhaust devices connected thereto may be further installed to reduce a time for exhausting.

Also, a substrate loaded into the chamber 10 for a thin film forming process may be seated on the substrate support unit 20. Here, the substrate may include a silicon carbide substrate containing silicon carbide (SiC) as a main component. Also, the substrate may include a silicon carbide single crystal wafer. As a dopant is injected into the silicon carbide single crystal wafer, a plurality of semiconductor regions may be formed in the wafer. Here, the plurality of semiconductor regions may include a source region, a drain region, and a well region. Here, the substrate support unit 20 may include, e.g., an electrostatic chuck to absorb and maintain the substrate by using an electrostatic force so that the substrate is seated and supported. Alternatively, the substrate support unit 30 may support the substrate by using vacuum absorption or a mechanical force.

The substrate support unit 20 may have a shape corresponding to that of the substrate, e.g., a circular shape or a square shape. The substrate support unit 20 may include a substrate support 24 on which the substrate is seated and an elevator 22 disposed below the substrate support 24 to elevate the substrate support 24. Here, the substrate support 24 may be manufactured larger than the substrate, and the elevator 22 may support at least one area, e.g., a central portion, of the substrate support 24 and move the substrate support 24 to be adjacent to the gas injection unit 30 when the substrate is seated on the substrate support. Also, a heater (not shown) may be installed in the substrate support 24. The heater generates heat at a predetermined temperature and heats the substrate support 24 and the substrate seated on the substrate support 24 so that a thin film is uniformly deposited on the substrate.

The gas supply unit 40 may pass through the cover 14 of the chamber 10 and include a first gas supply part 42 and a second gas supply part 44 for respectively supplying a first gas and a second gas to the gas injection unit 30. Here, the first gas may include a source gas for forming a gate insulation film, and the second gas may include a reactant gas. However, each of the first gas supply part 42 and the second gas supply part 44 does not necessarily provide one gas. Each of the first gas supply part 42 and the second gas supply part 44 may simultaneously supply a plurality of gases or supply a gas selected from the plurality of gases.

For example, the first gas supply part 42 may supply a gas containing a silicon (Si) component as the source gas or supply a gas containing at least one of hafnium (Hf), lanthanum (La), zirconium (Zr), tantalum (Ta), titanium (Ti), barium (Ba), strontium (Sr) and iridium (Ir). Also, the second gas supply part 44 may supply a gas containing oxygen (O) or nitrogen (N) as the reactant gas.

The gas injection unit 30 is installed in the chamber 10, e.g., installed on a bottom surface of the cover 14, and the first gas supply path for injecting and supplying the first gas onto the substrate and the second gas supply path for injecting and supplying the second gas onto the substrate are formed in the gas injection unit 30. As the first gas supply path and the second gas supply path are independently and separately formed, the first gas and the second gas may be separately supplied onto the substrate instead of being mixed in the gas injection unit 30.

The gas injection unit 30 may include an upper frame 32 and a lower frame 34. Here, the upper frame 32 is detachably coupled to the bottom surface of the cover 14, and at the same time, a portion of a top surface thereof, e.g., a central portion of the top surface, is spaced a predetermined distance from the bottom surface of the cover 14. Accordingly, the first gas supplied from the first gas supply part 42 may be diffused in a space between the top surface of the upper frame 32 and the bottom surface of the cover 14. Also, the lower frame 34 is spaced a predetermined distance from a bottom surface of the upper frame 32. Accordingly, the second gas supplied from the second gas supply part 44 may be diffused in a space between a top surface of the lower frame 34 and the bottom surface of the upper frame 32. The upper frame 32 and the lower frame 34 may be connected along outer circumference surfaces thereof to form a spaced space therebetween and integrated with each other. Alternatively, the outer circumference surfaces of the upper frame 32 and the lower frame 34 may be sealed by a separate sealing member.

The first gas supply path may be formed so that the first gas supplied from the first gas supply part 42 is diffused in the space between the bottom surface of the cover 14 and the upper frame 32 and supplied into the chamber 10 through the upper frame 32 and the lower frame 34. Also, the second gas supply path may be formed so that the second gas supplied from the second gas supply part 44 is diffused in the space between the bottom surface of the upper frame 32 and the top surface of the lower frame 34 and supplied into the chamber 10 through the lower frame 34. The first gas supply path and the second gas supply path may not communicate with each other, and thus the first gas and the second gas may be separately supplied into the chamber 10 from the gas supply unit 40 through the gas injection unit 30.

A first electrode 38 may be installed on the bottom surface of the lower frame 34, and a second electrode 36 may be spaced a predetermined distance from a lower side of the lower frame 34 and an outer side of the first electrode 38. Here, the lower frame 34 and the second electrode 36 may be connected along outer circumferential surfaces thereof. Alternately, the outer circumferential surfaces of the lower frame 34 and the second electrode 36 may be sealed by a separate sealing member.

As described above, when the first electrode 38 and the second electrode 36 are installed, the first gas may be injected onto the substrate through the first electrode 38, and the second gas may be injected onto the substrate through a spaced space between the first electrode 38 and the second electrode 36.

A RF power may be applied from the RF power supply 50 to one of the lower frame 34 and the second electrode 36. In FIG. 1, a structure in which the lower frame 34 is grounded, and the RF power is applied to the second electrode 36 is illustrated as an example. When the lower frame 34 is grounded, the first electrode 38 installed on the bottom surface of the lower frame 34 is also grounded. Thus, when the RF power supply 50 applies the RF power to the second electrode 36, a first activation region, i.e., a first plasma region, may be formed between the gas injection unit 30 and the substrate support unit 20, and a second activation region, i.e., a second plasma region, may be formed between the first electrode 38 and the second electrode 36.

Thus, when the second gas is injected through the spaced space between the first electrode 38 and the second electrode 36, the second gas may be activated in a region between the first electrode 38 and the second electrode 36, which corresponds to the inside of the gas injection unit 30, i.e., a region from the second plasma region to the first plasma region. Thus, the second gas may be activated in the gas injection unit 30 and injected onto the substrate in the deposition apparatus in accordance with an exemplary embodiment. Also, as the first gas supply path for supplying the first gas and the second gas supply path for supplying the second gas are separately formed, the source gas and the reactant gas may be distributed and injected through an optimized supply path for depositing the thin film as an example.

Hereinafter, a method for forming a thin film in accordance with an exemplary embodiment will be described in detail with reference to FIGS. 2 and 3. When the method for forming the thin film in accordance with an exemplary embodiment is described, a description overlapping that of the above-described deposition apparatus will be omitted.

Figure 2:
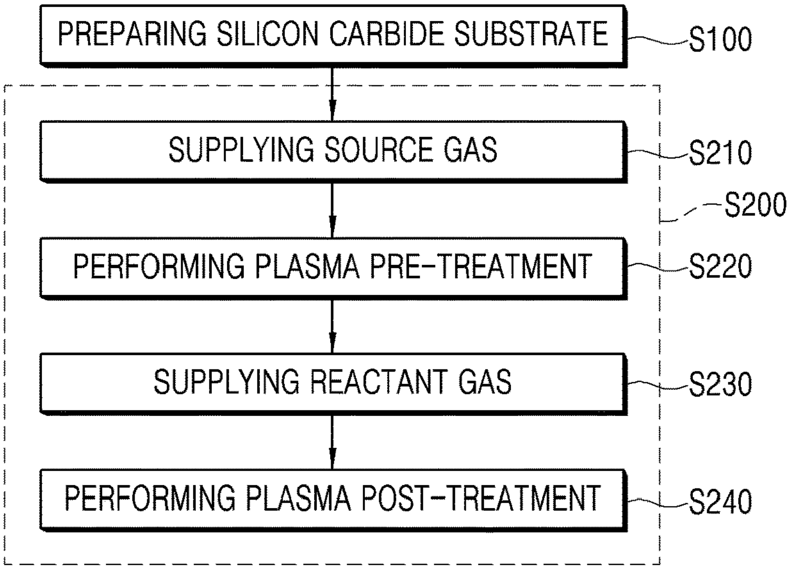
FIG. 2 is a schematic flowchart representing a method for depositing a thin film in accordance with an exemplary embodiment.
Figure 3:
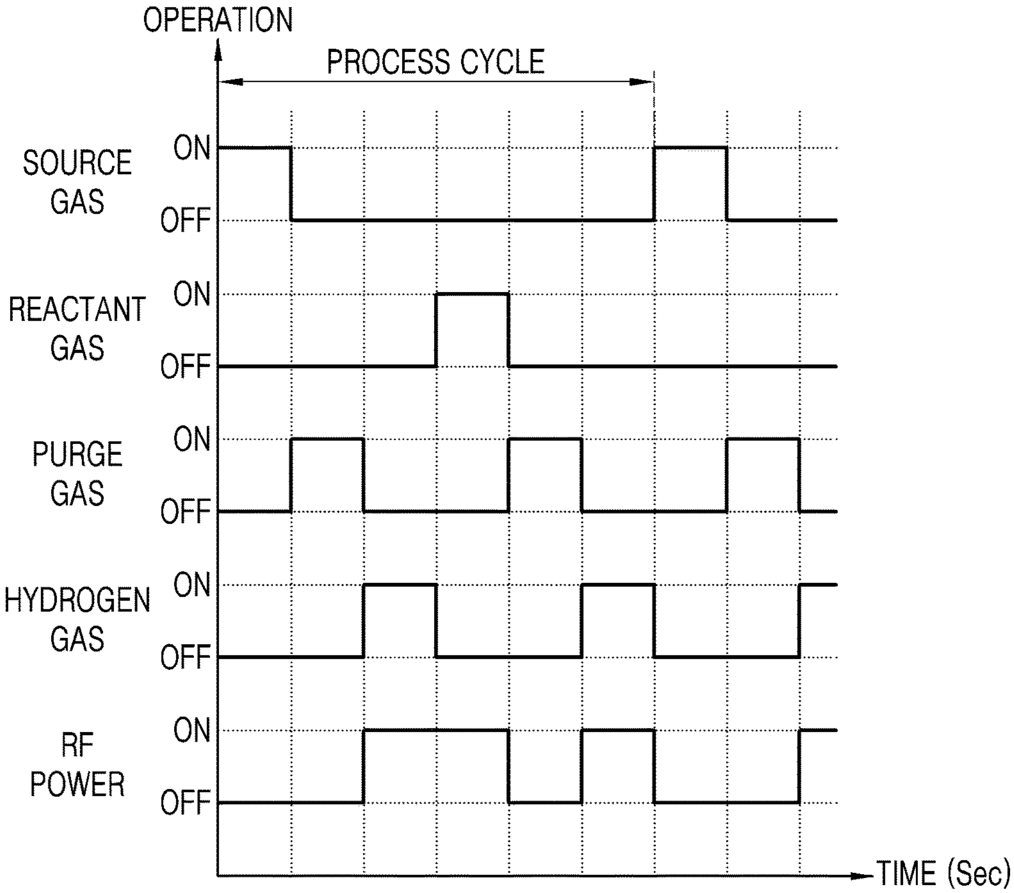
FIG. 3 is a graph for explaining a process cycle of forming a gate insulation film in accordance with an exemplary embodiment.

FIG. 2 is a schematic flowchart representing the method for forming the thin film in accordance with an exemplary embodiment, and FIG. 3 is a graph for explaining a process cycle of forming a gate insulation film in accordance with an exemplary embodiment.

Referring to FIGS. 2 and 3, the method for forming the thin film in accordance with an exemplary embodiment include a process S100 of preparing a silicon carbide substrate having a plurality of semiconductor regions and a process S200 of forming a gate insulation film on the silicon carbide substrate through an atomic layer deposition process at a temperature of 100° C. to 400° C.

The process S100 of preparing the silicon carbide substrate allows the silicon carbide substrate containing silicon carbide (SiC) as a main component to be loaded into a chamber 10 and seated on a substrate support unit 20. The silicon carbide substrate may have a plurality of semiconductor regions. That is, the silicon carbide substrate may include a silicon carbide single crystal wafer. As a dopant is injected into the silicon carbide single crystal wafer, a plurality of semiconductor regions may be formed in the wafer. Here, the plurality of semiconductor regions may include a source region, a drain region, and a well region, and a power semiconductor device manufactured by using the silicon carbide substrate having the source region, the drain region, and the well region will be described later with reference to FIG. 5.

After the process S100 of preparing the silicon carbide substrate, the process S200 of forming the gate insulation film on the silicon carbide substrate is performed. Here, the process S200 of forming the gate insulation film may be performed after the process S100 of preparing the silicon carbide substrate, and another process added for manufacturing a display device or a power semiconductor device may be performed between the process S100 of preparing a silicon carbide substrate and the process S200 of forming the gate insulation film. That is, although the silicon carbide substrate on which the gate electrode is already formed may be prepared in the process S100 of preparing the silicon carbide substrate, a process of forming the gate electrode on the silicon carbide substrate may be performed between the process S100 of preparing the silicon carbide substrate and the process S200 of forming the gate insulation film.

Here, the method for depositing the thin film in accordance with an exemplary embodiment may further include a process of performing plasma surface treatment on the silicon carbide substrate before the gate insulation film is formed on the silicon carbide substrate.

The process of performing the plasma surface treatment on the silicon carbide substrate may be performed to remove a natural oxide film formed on the silicon carbide substrate in the process S100 of preparing the silicon carbide substrate.

In the process of performing the plasma surface treatment on the silicon carbide substrate, a surface treatment gas may be injected onto the silicon carbide substrate through at least one of the first gas supply path and the second gas supply path of the above-described deposition apparatus, and a RF power supply 50 may apply a RF power to a process space to activate the surface treatment gas and generate plasma. Here, at least one of nitrous oxide ($N_2O$), nitrogen monoxide (NO), nitrogen ($N_2$), hydrogen ($H_2$), oxygen ($O_2$) and an argon gas may be used as the surface treatment gas. As described above, the natural oxide film formed on the surface of the silicon carbide substrate having a deposition surface for depositing the gate insulation film may be removed by performing the plasma surface treatment on the silicon carbide substrate before the gate insulation film is formed on the silicon carbide substrate.

The process S200 of forming the gate insulation film forms the gate insulation film at a temperature of 100° C. to 400° C. through an atomic layer deposition (ALD) process.

Typically, the gate insulation film is formed on the silicon carbide substrate at a high temperature of about 1200° C. or more through a thermal deposition process. However, when the gate insulation film is formed in a state in which the silicon carbide substrate is heated at the high temperature, the silicon carbide substrate and the thin film that is previously formed on the silicon carbide substrate may be damaged. As a result, a display device or a power semiconductor device to be manufactured may be remarkably degraded in quality and reliability. Thus, in accordance with an exemplary embodiment, the gate insulation film is formed on the silicon carbide substrate at a low temperature of 100° C. to 400° C. through the atomic layer deposition (ALD) process. Hereinafter, the process S200 of forming the gate insulation film will be described in more detail.

The process S200 of forming the gate insulation film may be performed by performing a process cycle of a process S210 of supplying a source gas onto the silicon carbide substrate and a process S230 of supplying a reactant gas onto the silicon carbide substrate a plurality of times.

The process S210 of supplying the source gas supplies the source gas onto the silicon carbide substrate. Here, the process S210 of supplying the source gas supplies the source gas onto the silicon carbide substrate through the above-described first gas supply path of the deposition apparatus. Here, the source gas may contain at least one of various source materials for forming the gate insulation film. For example, when the gate insulation film is formed as a silicon oxide ($SiO_2$) layer or a silicon nitride (SiN) layer, the source gas may be a silicon (Si)-containing gas, and when the gate insulation film is formed as a high-K dielectric layer, the source gas may be a gas including at least one of hafnium (Hf), lanthanum (La), zirconium (Zr), tantalum (Ta), titanium (Ti), barium (Ba), strontium (Sr) and iridium (Ir). The process S210 of supplying the source gas injects the source gas onto the silicon carbide substrate to be adsorbed thereto. Here, the process S210 of supplying the source gas may be performed without applying a power.

Here, the gate insulation film may include a high-K dielectric layer. That is, the gate insulation film may be formed as the high-K dielectric layer or may further include a silicon oxide ($SiO_2$) layer or a silicon nitride (SiN) layer formed on at least one of upper and lower portions of the high-K dielectric layer in addition to the high-K dielectric layer. Here, the gate insulation film may be formed such that the silicon oxide ($SiO_2$) layer is prepared on the silicon carbide substrate, the high-K dielectric layer is prepared on the silicon oxide ($SiO_2$) layer, and the silicon oxide ($SiO_2$) layer is prepared on the high-K dielectric layer again. When the gate insulation film has the above-described laminated structure, a high-K material forming the high-K dielectric layer may prevent a thin film transistor or an activation layer of a power semiconductor device from being damaged. Here, at least a portion of the silicon oxide ($SiO_2$) layer formed on the upper and lower portion of the high-K dielectric layer may be replaced by the silicon nitride (SiN) layer.

A process of purging the source gas may be performed after the process S210 of supplying the source gas. The process of purging the source gas may remove the source gas remained in the process space of the chamber 10. The process of purging the source gas may be performed by supplying an inert gas, e.g., an argon (Ar) gas, to the process space, and the argon (Ar) gas may be supplied through at least one of the first gas supply path and the second gas supply path. Here, the RF power supply 50 may not apply a RF power while the source gas is purged.

After the process of purging the source gas, a process S220 of performing plasma pre-treatment on the silicon carbide substrate may be performed. The process S220 of performing the plasma pre-treatment on the silicon carbide substrate may generate hydrogen plasma on the silicon carbide substrate by supplying a pre-treatment gas containing hydrogen, e.g., a hydrogen ($H_2$) gas, onto the substrate and applying the RF power. Here, the hydrogen ($H_2$) gas may be supplied through at least one of the first gas supply path and the second gas supply path. When a process S220 of activating and supplying the pre-treatment gas containing hydrogen is performed after a raw material is adsorbed to the silicon carbide substrate, impurities contained in the raw material adsorbed to the silicon carbide substrate may be removed by the hydrogen plasma, and the raw material may be further firmly adsorbed to the silicon carbide substrate.

After the process S220 of performing the plasma pre-treatment on the silicon carbide substrate, the process S230 of supplying the reactant gas is performed. The process S230 of supplying the reactant gas supplies, e.g., an oxygen-containing reactant gas onto the silicon carbide substrate. Here, the process S230 of supplying the reactant gas supplies the reactant gas containing oxygen onto the substrate through the above-described second gas supply path of the deposition apparatus. When the reactant gas is supplied onto the substrate to which the raw material is adsorbed, the raw material reacts with a reactant contained in the reactant gas.

Here, in the process S230 of supplying the reactant gas, the RF power supply 50 may apply the RF power to the process space to activate the reactant gas and generate plasma, so that the oxygen component contained in the reactant gas effectively reacts with the source material. As described above, the oxygen-containing gas supplied as the reactant gas is activated and supplied in the process S230 of supplying the reactant gas and may be activated into oxygen radicals to react with the source material, and the gate insulation film may be formed on the substrate at a further low process temperature. That is, when the reactant gas is activated and supplied onto the substrate, the process S200 of forming the gate insulation film may be performed by controlling the process space of the chamber 10 at a low temperature of 100° C. or more to 400° C. or less.

After the process S230 of supplying the reactant gas, a process of purging the reactant gas may be performed. The process of purging the reactant gas may remove the reactant gas remained in the process space of the chamber 10. The process of purging the reactant gas may be performed by supplying an inert gas, e.g., an argon (Ar) gas, to the process space as same as the process of purging the source gas, and the argon (Ar) gas may be supplied through at least one of the first gas supply path and the second gas supply path.

After the process of purging the reactant gas, a process S240 of performing plasma post-treatment on the silicon carbide substrate may be performed. The process S240 of performing the plasma post-treatment on the silicon carbide substrate may generate hydrogen plasma on the silicon carbide substrate by supplying a post-treatment gas containing hydrogen, e.g., a hydrogen ($H_2$) gas, onto the substrate and applying the RF power. Here, the hydrogen ($H_2$) gas may be supplied through at least one of the first gas supply path and the second gas supply path.

When the hydrogen plasma is generated on the substrate after the gate insulation film is formed on the silicon carbide substrate as the source gas and the reactant gas are injected, the gate insulation film, particularly the gate insulation film formed of the high-K dielectric layer, may be easily formed even when the inside of the chamber or the silicon carbide substrate has a low temperature. That is, when the inside of the chamber or the silicon carbide substrate has a low temperature, the gate insulation film formed of the high-K dielectric layer may be formed at a low temperature of, e.g., 100° C. to 400° C. In addition, impurities remained in the chamber 10 or impurities contained in the gate insulation film may be effectively removed by the process S240 of activating and supplying the post-treatment gas containing hydrogen onto the silicon carbide substrate.

As described above, a process cycle of the process S210 of supplying the source gas, the process S220 of performing the plasma pre-treatment on the silicon carbide substrate, the process S230 of supplying the reactant gas, and the process S240 of performing the plasma post-treatment on the silicon carbide substrate may be performed a plurality of times. More specifically, the process S210 of supplying the source gas, the process S220 of performing the plasma pre-treatment on the silicon carbide substrate, the process S230 of supplying the reactant gas, and the process S240 of performing the plasma post-treatment on the silicon carbide substrate may form one process cycle, and the process cycle may be repeated until the gate insulation film having a desired thickness is formed on the substrate.

Figure 4:
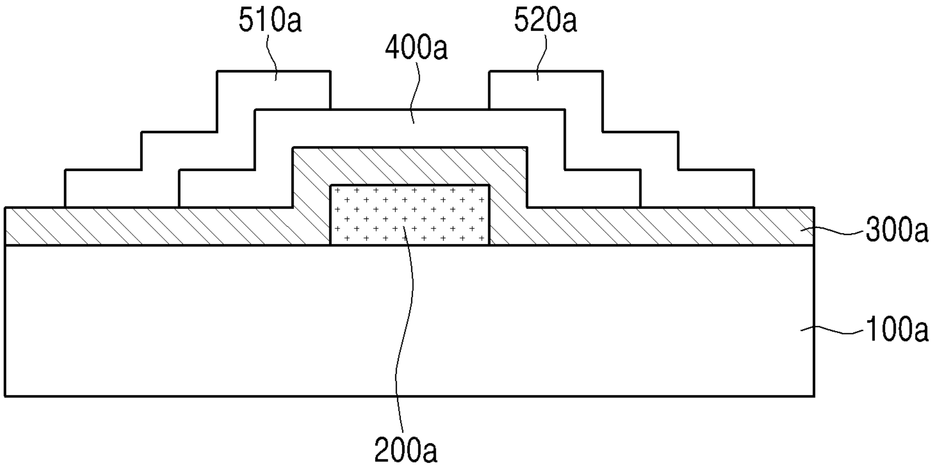
FIG. 4 is a view illustrating one example of a thin film transistor manufactured in accordance with an exemplary embodiment.

FIG. 4 is a view illustrating one example of the thin film transistor manufactured in accordance with an exemplary embodiment.

Referring to FIG. 4, the thin film transistor in accordance with an exemplary embodiment includes a gate electrode 200*a*, a source electrode 510*a* and a drain electrode 520*a* disposed above or below the gate electrode 200*a* and spaced apart from each other in a horizontal direction, an active layer 400*a* disposed between the gate electrode 200*a*, the source electrode 510*a*, and the drain electrode 520*a*, and a gate insulation film 300*a* disposed between the gate electrode 200*a* and the active layer 400*a*.

Here, as illustrated in FIG. 4, the thin film transistor in accordance with an exemplary embodiment may be a bottom gate type thin film transistor including the gate electrode 200*a* formed on a silicon carbide substrate 100*a*, the gate insulation film 300*a* formed on the gate electrode 200*a*, the active layer 400*a* formed on the gate insulation film 300*a*, and the source electrode 510*a* and the drain electrode 520*a* spaced apart from each other on the active layer 400*a*. Alternatively, the thin film transistor may be a top gate type thin film transistor in which the gate electrode 200*a* is disposed at an upper portion thereof.

Here, the silicon carbide substrate 100*a* may include a substrate containing silicon carbide (SiC) as a main component. Here, the substrate may include silicon carbide single crystal wafer.

The gate electrode 200*a* may be made of a conductive material. For example, the gate electrode 200*a* may be made of at least one metal of aluminum (Al), neodymium (Nd), silver (Ag), chrome (Cr), titanium (Ti), tantalum (Ta), molybdenum (Mo), and copper (Cu) or an alloy thereof. Also, the gate electrode 200*a* may be formed as multiple layers consisting of a plurality of metal layers in addition to a single layer. That is, the gate electrode 200*a* may be formed as double layers including a metal layer made of metal having an excellent physicochemical characteristic such as chrome (Cr), titanium (Ti), tantalum (Ta), or molybdenum (Mo) and a metal layer made of metal having a low specific resistance such as aluminum (Al)-based metal, silver (Ag)-based metal, or copper (Cu)-based metal.

The gate insulation film 300*a* may be formed on the gate electrode 200*a*. That is, the gate insulation film 300*a* may be formed on the silicon carbide substrate 100*a* and upper and side portions of the gate electrode 200*a*. The gate insulation film 300*a* may be formed as a thin film using silicon oxide ($SiO_2$) having excellent adhesion to a metal material and excellent insulation resistance. Alternatively, the gate insulation film 300*a* may be formed as a high-K dielectric material having a dielectric constant greater than that of the silicon oxide ($SiO_2$). That is, the gate insulation film 300*a* may include at least one high-K dielectric layer. Here, the high-K dielectric material may include at least one of hafnium oxide ($HfO_2$), hafnium silicon oxide ($HfSiO_4$), lanthanum oxide ($LaO_2$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTiO_3$), barium titanium oxide ($BaTiO_3$), strontium titanium oxide ($SrTiO_3$), and iridium oxide ($IrO_2$).

The gate insulation film 300*a* may be formed by the method for depositing the thin film in accordance with an exemplary embodiment including the process S100 of preparing the silicon carbide substrate and the process S200 of forming the gate insulation film on the silicon carbide substrate at the temperature of 100° C. to 400° C. through the atomic layer deposition process. That is, the gate insulation film 300*a* may be formed by the method for depositing the thin film, which performs the process cycle of the process S210 of supplying the source gas, the process S220 of performing the plasma pre-treatment on the silicon carbide substrate, the process S230 of supplying the reactant gas, and the process S240 of performing the plasma post-treatment on the silicon carbide substrate a plurality of times.

The active layer 400*a* is formed on the gate insulation film 300*a*, and at least a portion of the active layer 400*a* overlaps the gate electrode 200*a*. The active layer 400*a* may be formed as, e.g., a metal oxide thin film consisting of a single metal oxide thin film or a plurality of metal oxide thin films. The metal oxide thin film may include zinc oxide (ZnO) or a material in which at least one of indium (In) and gallium (Ga) is doped in the zinc oxide (ZnO).

The source electrode 510*a* and the drain electrode 520*a* may be formed on the active layer 400*a*. The source electrode 510*a* and the drain electrode 520*a* may be spaced apart from each other with the gate electrode 200*a* therebetween while partially overlapping the gate electrode 200*a*. The source electrode 510*a* and the drain electrode 520*a* may be made of the same material by the same process. For example, the source electrode 510*a* and the drain electrode 520*a* may be made of at least one metal of aluminum (Al), neodymium (Nd), silver (Ag), chrome (Cr), titanium (Ti), tantalum (Ta), and molybdenum (Mo) or an alloy thereof. That is, the source electrode 510*a* and the drain electrode 510*b* may be made of the same material as the gate electrode 200*a* or a different material from the gate electrode 200*a*. Also, each of the source electrode 510*a* and the drain electrode 520*a* may be formed by a single layer or multiple layers consisting of a plurality of metal layers.

Figure 5:
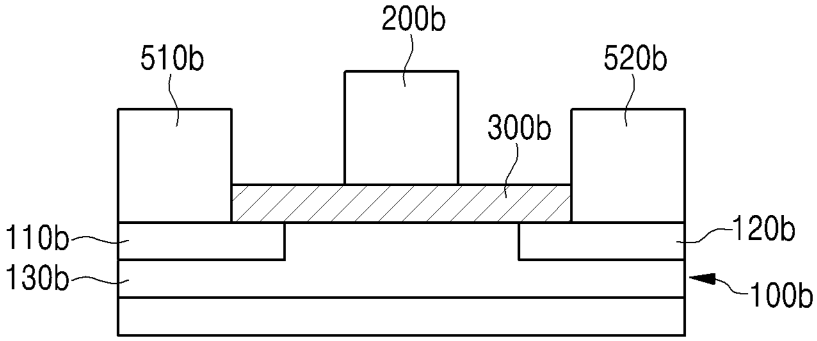
FIG. 5 is a view illustrating one example of a power semiconductor device manufactured in accordance with an exemplary embodiment.

FIG. 5 is a view illustrating one example of the power semiconductor device manufactured in accordance with an exemplary embodiment.

Referring to FIG. 5, the power semiconductor device, e.g., a field effect transistor (FET), manufactured in accordance with an exemplary embodiment includes a silicon carbide substrate 100*b*, a gate insulation film 300*b* formed on the silicon carbide substrate 100*b*, a source electrode 510*b* and a drain electrode 520*b* spaced apart from each other with the gate insulation film 300*b* therebetween in a horizontal direction on the silicon carbide substrate 100*b*, and a gate electrode 200*b* disposed on the gate insulation film 300*b* between the source electrode 510*b* and the drain electrode 520*b*. Here, the silicon carbide substrate 100*b* may include a substrate in which a plurality of semiconductor regions are formed as a dopant is injected. The plurality of semiconductor regions may include a source region 110*b* functioning as a source of the field effect transistor, a drain region 120*b* functioning as a drain of the field effect transistor, and a well region 130*b* functioning as an active layer of the field effect transistor.

Here, the power semiconductor device may be manufactured by the method for depositing the thin film in accordance with an exemplary embodiment including the process S100 of preparing the silicon carbide substrate 100*b* and the process S200 of forming the gate insulation film on the silicon carbide substrate 100*b* at the temperature of 100° C. to 400° C. through the atomic layer deposition process in order to form the gate insulation film 200*b* on the silicon carbide substrate 100*b*.

That is, in the power semiconductor device, the gate insulation film 300*b* may be formed by the method for depositing the thin film, which performs the process cycle of the process S210 of supplying the source gas, the process S220 of performing the plasma pre-treatment on the silicon carbide substrate, the process S230 of supplying the reactant gas, and the process S240 of performing the plasma post-treatment on the silicon carbide substrate a plurality of times.

Here, the gate insulation film 300*b* may include at least one high-K dielectric layer, and the high-K dielectric material may include at least one of hafnium oxide ($HfO_2$), hafnium silicon oxide ($HfSiO_4$), lanthanum oxide ($LaO_2$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTiO_3$), barium titanium oxide ($BaTiO_3$), strontium titanium oxide ($SrTiO_3$), and iridium oxide ($IrO_2$), which is as same as the above-described thin film transistor. Thus, overlapping descriptions will be omitted.

In accordance with the exemplary embodiment, the gate insulation film may be formed on the silicon carbide substrate through the low temperature process. Also, the time for increasing the temperature of the substrate to form the gate insulation film may be saved, and thus the time for manufacturing the display device or the power semiconductor device may be reduced.

Also, in accordance with the exemplary embodiment, the display device or the power semiconductor device having the high breakdown voltage and the excellent heat dissipation property may be manufactured.

Although the specific embodiments are described and illustrated by using specific terms, the terms are merely examples for clearly explaining the embodiments, and thus, it is obvious to those skilled in the art that the embodiments and technical terms can be carried out in other specific forms and changes without changing the technical idea or essential features. Therefore, it should be understood that simple modifications according to the embodiments of the present inventive concept may belong to the technical spirit of the present inventive concept.

What is claimed is:

1. A method for depositing a thin film, comprising:

preparing a silicon carbide substrate having a plurality of semiconductor regions; and forming a gate insulation film on the silicon carbide substrate at a temperature of 100° C. to 400° C. through an atomic layer deposition process;

wherein the forming of the gate insulation film comprises:

supplying a source gas onto the silicon carbide substrate;

performing a plasma pre-treatment on the silicon carbide substrate;

supplying a reactant gas onto the silicon carbide substrate; and performing a plasma post-treatment on the silicon carbide substrate, wherein a process cycle comprising the supplying of the source gas, the performing of the plasma pre-treatment, the supplying of the reactant gas, and the performing of the plasma post-treatment is performed a plurality of times, wherein the performing of the plasma pre-treatment and the performing of the plasma post-treatment comprise:

injecting a hydrogen gas onto the silicon carbide substrate; and discharging the hydrogen gas and generating plasma on the silicon carbide substrate.

2. The method for depositing the thin film of claim 1, wherein the gate insulation film comprises a high-K dielectric layer.

3. The method for depositing the thin film of claim 2, wherein the gate insulation film further comprises a silicon oxide layer or a silicon nitride layer disposed on at least one of upper and lower portions of the high-K dielectric layer.

4. The method for depositing the thin film of claim 1, wherein the preparing of the silicon carbide substrate prepares the silicon carbide substrate having a source region, a well region, and a drain region, and the forming of the gate insulation film forms the gate insulation film on the well region.

5. The method for depositing the thin film of claim 1, further comprising removing impurities of the silicon carbide substrate before the forming of the gate insulation film.

6. The method for depositing the thin film of claim 5, wherein the impurities comprise a natural oxide film.

7. The method for depositing the thin film of claim 5, wherein the removing of the impurities comprises performing a plasma surface treatment on the silicon carbide substrate.

8. The method for depositing the thin film of claim 2, wherein the performing of the plasma surface treatment comprises forming plasma by supplying and activating at least one of nitrous oxide (N2O), nitrogen monoxide (NO), nitrogen (N2), hydrogen (H2), oxygen (O2), and an argon gas onto the silicon carbide substrate.

* * * * *